United States Patent [19]
Jones et al.

[11] Patent Number: 5,337,207
[45] Date of Patent: Aug. 9, 1994

[54] HIGH-PERMITTIVITY DIELECTRIC CAPACITOR FOR USE IN A SEMICONDUCTOR DEVICE AND PROCESS FOR MAKING THE SAME

[75] Inventors: Robert E. Jones; Papu D. Maniar; C. Joseph Mogab, all of Austin, Tex.

[73] Assignee: Motorola, Schaumburg, Ill.

[21] Appl. No.: 993,987

[22] Filed: Dec. 21, 1992

[51] Int. Cl.⁵ .............................................. H01G 4/10
[52] U.S. Cl. ................................ 361/321.1; 361/322; 361/328
[58] Field of Search .................. 361/321.1, 322, 311, 361/328; 257/295; 29/25.42

[56] References Cited

U.S. PATENT DOCUMENTS

| | | | |
|---|---|---|---|
| 4,027,209 | 5/1977 | Maher | 361/321 |
| 4,712,156 | 12/1987 | Bardhan | 361/321 |
| 5,023,750 | 6/1991 | Hirayama | 361/313 |
| 5,046,043 | 9/1991 | Miller et al. | 365/145 |
| 5,214,300 | 5/1993 | Rohrer et al. | 257/295 |

OTHER PUBLICATIONS

Parikh, N. R., et al., "Study Of Diffusion Barriers For PZT Deposited On Si For Non-Volatile Random-Access Memory Technology", Mat. Res. Soc. Proc. vol. 200, 1990 Materials Research Soc.

Chikarmane, V., et al., "The Effects Of Lead-Compendation And Thermal Processing On The Characteristics Of DC-Magnetron Sputtered Lead Zirconate Titanate Thin Films", Mat. Res. Soc. Proc., vol. 230, Spring Meeting 1991.

Primary Examiner—Marvin M. Lateef
Attorney, Agent, or Firm—Jasper W. Dockrey

[57] ABSTRACT

A high-permittivity dielectric capacitor (28) having a refractory-metal oxide layer (16) framing the first electrode (14) of the capacitor (28) and separating a high-permittivity dielectric layer (24) from an insulating layer (12) underlying the capacitor (28). The high-permittivity dielectric layer (16) makes contact with the first electrode (14) through an opening (18) in the refractory-metal oxide layer (16). The refractory-metal oxide layer (16) separates the high-permittivity dielectric layer (24) from the insulating layer (12) in all regions away from the opening (18) in the refractory-metal oxide layer (16). During fabrication of the capacitor (28), when the high-permittivity dielectric layer (24) is patterned, the refractory-metal oxide layer (16) provides an etch-stop.

20 Claims, 3 Drawing Sheets

HIGH-PERMITTIVITY DIELECTRIC CAPACITOR FOR USE IN A SEMICONDUCTOR DEVICE AND PROCESS FOR MAKING THE SAME

RELATED APPLICATION

Related material is disclosed in a commonly assigned, co-pending patent application having attorney docket number SC01808A filed concurrently herewith.

1. Field of the Invention

This invention relates in general to semiconductor devices and methods for fabrication, and more particularly to a high-permittivity dielectric capacitor for use in a semiconductor device and a process for fabricating the capacitor.

2. Background of the Invention

As the overall dimensions of semiconductor devices continue to shrink, the demand is ever increasing for devices having large charge storage capacity. The need for large charge storage capacity remains even though individual components are scaled to smaller dimensions. As the surface area of a component, such as a capacitor, is reduced, a corresponding reduction in charge storage capability occurs. The smaller surface area available for components, such as transistors, capacitors, and the like, coupled with the requirement to maintain high charge storage levels, has led researchers in the field of fabrication science to seek new materials from which to construct the components. One group of promising new dielectric materials is the family of high-permittivity, ceramic dielectrics. For semiconductor applications, one of the most highly developed high-permittivity dielectric materials is PZT. PZT dielectrics are ferroelectric compounds including lead (Pb), zirconium(Zr), and titanium (Ti) oxides; hence the acronym "PZT."

Ferroelectric compounds are capable of being polarized by an applied voltage and of retaining the polarization after the applied voltage has been removed. Responding to an applied voltage, the ferroelectric material assumes one of two remnant polarization states after the applied voltage is withdrawn. The ability to polarize a PZT ferroelectric and to design circuitry to detect the polarization state, makes the ferroelectric material a desirable compound from which to construct nonvolatile memory devices, such as nonvolatile random access memory devices, and the like.

While ferroelectric devices offer a substantial improvement in compact charge storage capability, the use ferroelectric components in MOS integrated circuit technology has been limited by the physical and chemical characteristics of the ferroelectric materials. For example, if PZT, which has been deposited by a sol-gel process, comes in contact with water before it is annealed, the PZT will not become ferroelectric upon subsequent crystallization. In addition, problems of materials compatibility with the conductive and insulating materials commonly used in integrated circuit fabrication have further constrained the application of high-permittivity dielectric devices. For example, during the annealing of a PZT material, PZT or constituents from the PZT material readily diffuses into common insulation layers, such as silicon dioxide, silicon nitride, and the like. To realize the full potential of high-permittivity dielectric devices in MOS integrated circuit technology, improved processing and structural design is necessary.

SUMMARY OF THE INVENTION

In practicing the present invention, there is provided a high-permittivity dielectric capacitor and a process for fabricating the capacitor. The first electrode of the capacitor is framed with a refractory-metal oxide layer. The refractory-metal oxide layer separates the high-permittivity dielectric material in the capacitor from an insulating layer underlying the capacitor. The refractory-metal oxide frame virtually prevents ferroelectric constituents from the high-permittivity dielectric material from diffusing into the underlying insulating layers.

In one embodiment of the invention, a semiconductor substrate is provided having an insulating layer thereon. A first electrode is formed on the insulating layer and a refractory-metal oxide layer overlies a portion of the first electrode. An opening in the refractory-metal oxide layer exposes a portion of the first electrode. A patterned high-permittivity dielectric layer overlies the refractory-metal oxide layer and the exposed portion of the first electrode. The patterned high-permittivity dielectric layer is separated from the insulating layer by at least the refractory-metal oxide layer in all regions away from the exposed portion of the first electrode. A second electrode overlies the high-permittivity dielectric layer.

Figure 1:
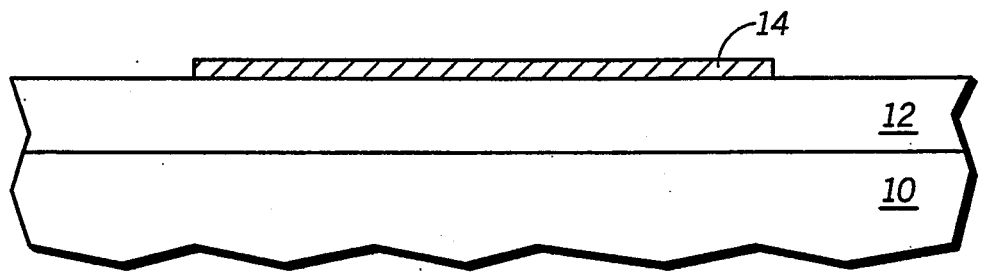
FIGS. 1 through 5, illustrate, in cross section, process steps in the fabrication of a high-permittivity dielectric capacitor formed in accordance with the present invention.

It is appreciated that for simplicity and clarity of illustration, elements shown in the figures are not necessarily been drawn to scale. For example, the dimensions of some of the elements may be exaggerated relative to each other for clarity. Further, where considered appropriate, reference numerals have been repeated among the figures to indicate corresponding elements.

DETAILED DESCRIPTION OF PREFERRED EMBODIMENTS

The present invention provides a high-permittivity dielectric capacitor in an integrated circuit. A substantial improvement in the fabrication of a high-permittivity dielectric capacitor is realized by framing the lower electrode of the capacitor with a refractory-metal oxide layer. By framing the lower electrode, it is meant that the refractory-metal oxide layer separates the high-permittivity dielectric material from underlying insulating layers. The refractory-metal oxide frame virtually prevents ferroelectric constituents from the high-permittivity dielectric material from diffusing into the underlying insulating layers. The out-diffusion of ferroelectric constituents from the high-permittivity dielectric material into an insulating layer causes the dielectric material to lose its ferroelectric properties. The refractory-metal oxide frame also improves process reliability and process flexibility by acting as an etch-stop layer during capacitor fabrication.

The high-permittivity dielectric capacitor of the present invention can be used in any integrated circuit including ferroelectric devices, and nonvolatile random access memory devices, or the like. In many integrated circuits, capacitors are not formed until other circuit components, such as transistors, resistors, diodes, and the like, have already been fabricated on the substrate. After these components are formed, an insulating layer is deposited to overlie the components. Openings are formed in the insulating layer for the purpose of electrically contacting the components. Accordingly, for purposes of illustrating the invention, it is assumed that the structures illustrated in the figures are formed on an insulating layer, which overlies other integrated circuit components. However, the invention can be practiced to its fullest extent on a single, monolithic semiconductor substrate, or on a substrate that is at an intermediate stage in an integrated circuit fabrication process.

FIGS. 1 through 5, illustrate, in cross section, process steps in the fabrication of a high-permittivity dielectric capacitor in accordance with the present invention. Those skilled in the art appreciate that, although not illustrated in the figures, many other components can be present, and that the capacitor illustrated in the figures is typically only one element of many components and capacitors in an integrated circuit.

FIG. 1 includes an illustration of a semiconductor substrate 10 having an insulating layer 12 and a patterned first electrode 14 thereon. Insulating layer 12 can be a deposited silicon oxide or silicon nitride passivation layer. Alternatively, insulating layer 12 can be a spin-on-glass (SOG) layer or other passivating material. In the case where the capacitor of the invention is being formed at an early stage in the integrated circuit fabrication process, insulating layer 12 can be a silicon oxide or silicon nitride dielectric layer.

Preferably, first electrode 14 is formed by first depositing a layer of titanium, followed by depositing a layer of platinum onto the titanium. The titanium layer adheres to the platinum layer and the insulating layer and thereby reducing the likelihood of possible cracking or peeling of the platinum layer. First electrode 14 is defined by forming photolithographic pattern on the platinum layer, then performing an ion milling process to etch both the platinum layer and the underlying titanium layer. In another method, a sequential, two-step etching process can be used, wherein the platinum layer is etched in a wet etching solution and the titanium layer is etched in a reactive ion etching apparatus using chlorinated and fluorinated etch gases. Preferably, the wet etching solution is an aqueous solution containing hydrogen chloride, nitric acid, and a metal etching solution. The metal etching solution is commercially available from Olin Hunt Specialty Products Inc. of West Paterson, N.J. and is known by the trade designation "M2S." The metal etching solution contains 60–80 weight % phosphoric acid, 10–25 weight % acetic acid, 0.1–5.0 weight % nitric acid, and remainder water.

Alternatively, first electrode 14 can be formed by depositing a layer of platinum onto insulating layer 12. The platinum layer is covered with a photomask and is then patterned using a wet etch or an ion milling process to form the first electrode 14.

In another alternative, first electrode 14 can be a conductive metal oxide, such as ruthenium dioxide. In one method, ruthenium dioxide can be formed by reactive sputter deposition of ruthenium in an oxygen containing atmosphere. In another method, ruthenium dioxide can be formed by organometallic chemical vapor deposition of ruthenium followed by an oxidation step. For example, ruthenium can be deposited by chemical vapor deposition of an organoruthenium complex, such as bis(cyclopenta-dienyl) ruthenium (Ru $(C_5H_5)_2$), triruthenium dodecacarbonyl ($Ru_3(CO)_{12}$), and the like, or alternatively, a halogenated compound, such as ruthenium tetrachloride ($RuCl_4$). The ruthenium film is then oxidized in an oxygen atmosphere at about 500° to 1000° C.

Figure 2:
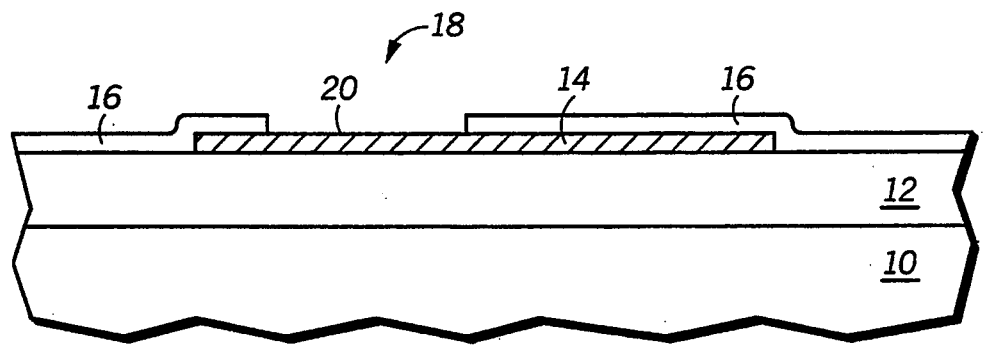

After first electrode 14 is formed, a refractory-metal oxide layer 16 is deposited and patterned to form an opening 18. Opening 18 exposes a surface portion 20 of first electrode 14, as illustrated in FIG. 2. In practicing the invention, different process alternatives can be use to form the refractory-metal frame. In a first method, refractory-metal oxide layer 16 is formed by reactive sputter deposition of a refractory-metal oxide. The refractory-metal oxide can be titanium dioxide ($TiO_2$), tantalum pentoxide ($Ta_2O_5$), zirconium oxide ($ZrO_2$), or hafnium dioxide ($HfO_2$). In a second method, titanium dioxide or tantalum pentoxide can be formed by metal-organic chemical vapor deposition (MOCVD). The refractory-metal oxide is covered with a photomask and patterned using, preferably, a reactive ion etch process, or alternatively, an ion milling etch process. The reactive ion etch selectively etches the refractory-metal oxide to the underlying electrode material. For example, where refractory-metal oxide layer 16 is $TiO_2$ or $Ta_2O_5$, and first electrode 14 is platinum, a carbon tetrafluoride and oxygen reactive ion etching process can be used to preferentially etch the refractory-metal oxide layer. In a third method, refractory-metal oxide layer 16 is formed by depositing of a pure refractory-metal, such as titanium or tantalum. Following deposition, an oxidation process is carried out to convert the refractory-metal into a refractory-metal oxide. The refractory-metal can be deposited by sputter deposition or chemical vapor deposition, or the like. Once the refractory-metal layer is deposited, opening 18 can be formed either before or after oxidation. In the case where the refractory-metal layer is patterned and opening 18 is formed prior to oxidation, the oxidation step can be performed immediately thereafter, or the oxidation step can be performed at a later point in the process.

Although several different process methods can be used to form refractory-metal oxide layer 16, it is important to note that in all the process methods described herein, refractory-metal oxide layer 16 covers all portions of first electrode 14 except for surface portion 20, and that refractory-metal oxide layer 16 covers all surface portions of insulating layer 12. The importance of this aspect of the invention will subsequently become apparent.

After opening 18 is formed, a high-permittivity dielectric material is formed on surface portion 20. In one embodiment, the high-permittivity dielectric is a ferroelectric material, such as a perovskite crystalline compound having the general formula, $ABO_3$. Common ferroelectric materials are lead titanate, lead zirconium titanate (PZT), barium titanate, and the like. Referring to the general formula, in a PZT film the "A" of the $ABO_3$ is lead, and the "B" of the $ABO_3$ is zirconium and titanium. In addition, a dopant, such as lanthanum, can be incorporated into the perovskite crystal with the lead as part of "A". When lanthanum is included the material is commonly referred to as lead lanthanum zirconium titanate (PLZT). The ferroelectric material can be deposited by spin-coating using a sol-gel solution, or alternatively, by a method, such as sputter deposition or MOCVD. Following deposition, the ferroelectric material is annealed in oxygen to form the crystalline perovskite phase.

The high-permittivity dielectric material directly contacts surface portion 20 of first electrode 14 through opening 18 and is separated from insulating layer 12 by refractory-metal oxide layer 16 in all regions away from opening 18. During the crystallization process, it is important that the ferroelectric material not come in direct contact with insulating layer 12. Ferroelectric constituents diffuse into common insulating materials, such as silicon oxide, silicon nitride, boron nitride, and the like. The out-diffusion of ferroelectric constituents destroys the ferroelectric properties of the high-permittivity dielectric material. In addition, side reactions, which are unwanted and may occur because of the diffusion, generally increase tensile stress and cause the ferroelectric material to "bubble-up" and peel away from the insulating layer. The present invention advantageously prevents out-diffusion and unwanted side reactions by separating the ferroelectric material from the insulating material by refractory-metal oxide 16. Refractory-metal oxide layer 16 seals first electrode 14 to insulating layer 12, and covers all regions of insulating layer 12, such that the high-permittivity dielectric material cannot, at any point, come into direct contact with insulating layer 12.

Figures 1, 3:
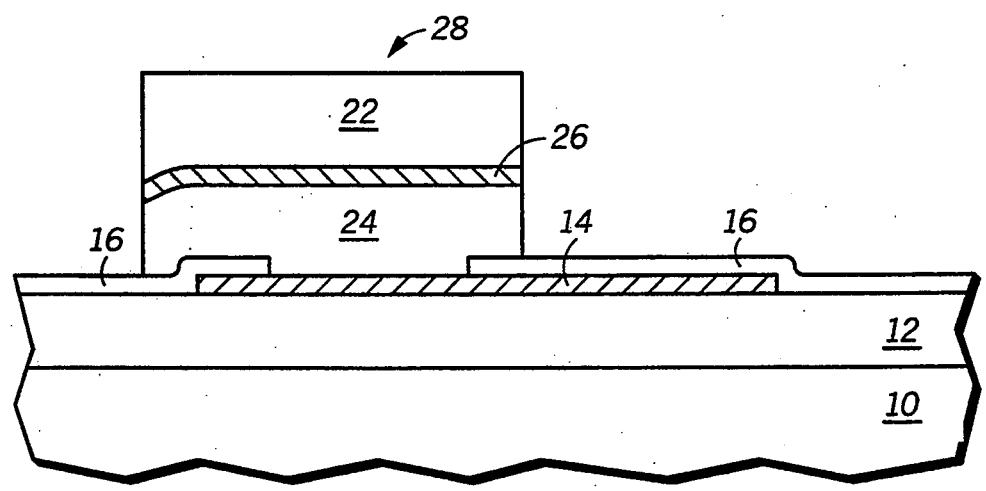
Figures 2, 3:
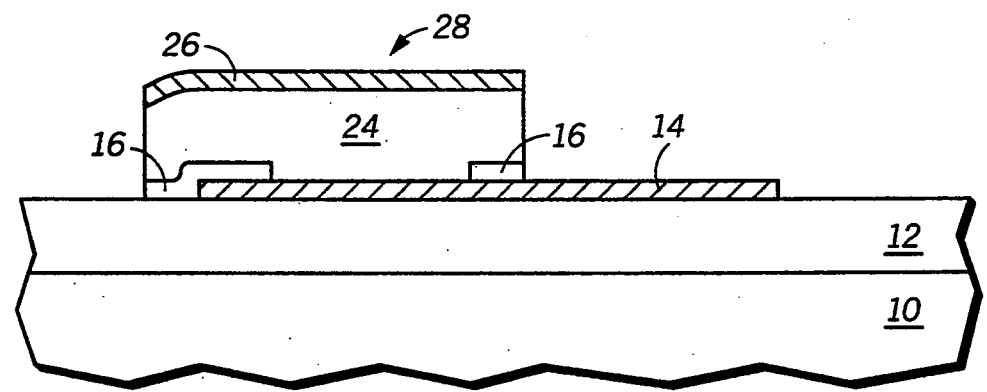
Figure 3:
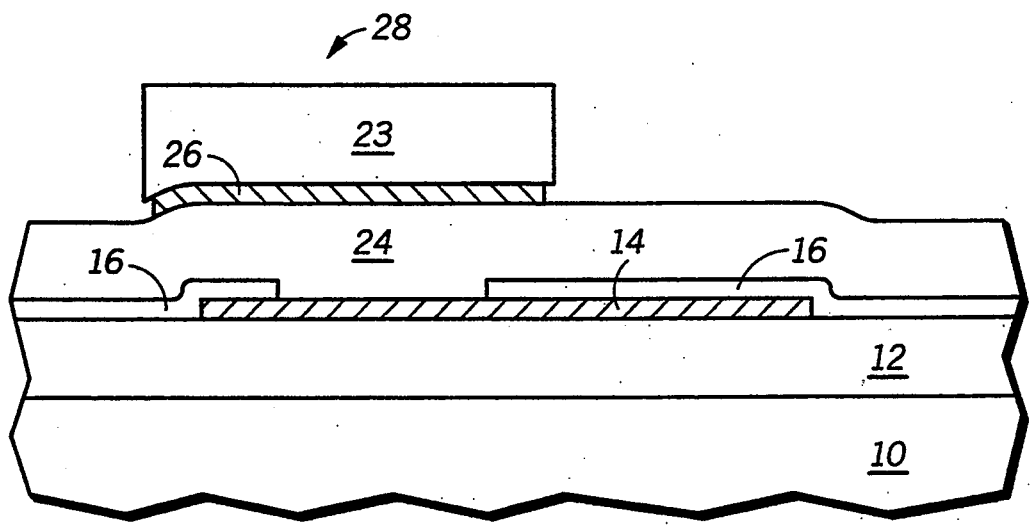
Figures 3, 4:
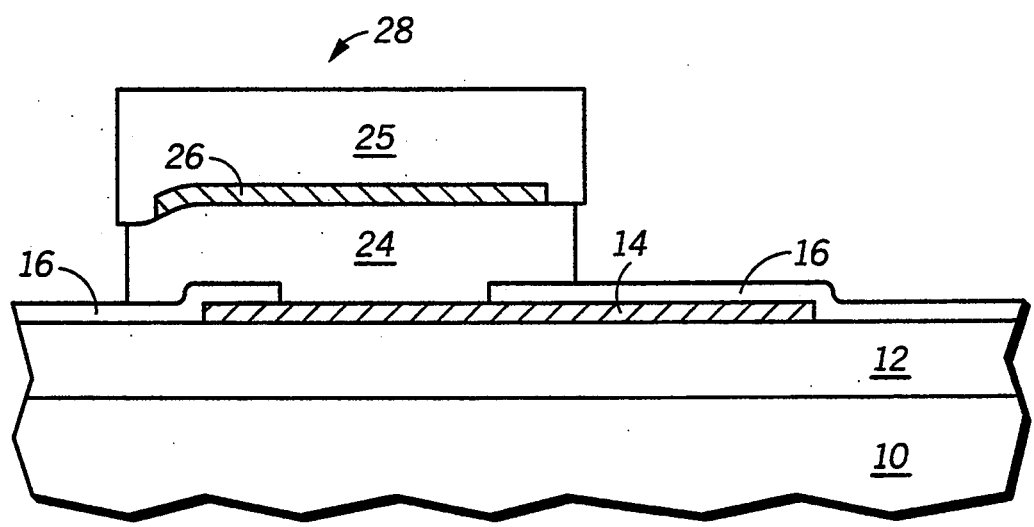

At this stage in the process, subsequent processing can vary depending upon the characteristics of the capacitor being fabricated, the etching methods employed, and the desired method of interconnecting the capacitor to other components in the integrated circuit. For example, if the capacitor is being fabricated as an individual element, the top electrode material is deposited prior to patterning the high-permittivity dielectric material. In this case, if anisotropic etching methods, such as ion milling or reactive ion etching, are employed, both an overlying electrode and an underlying high-permittivity dielectric layer can be formed using a single photolithographic mask. The single mask, anisotropic etch process is illustrated in FIGS. 3-1 and 3-2. However, if isotropic etch methods, such as wet chemical etches, are employed, a first photolithographic mask is used to form the top electrode, and a second photolithographic mask is used to pattern the high-permittivity dielectric layer. The dual mask, isotropic etch process is illustrated in FIGS. 3-3 and 3-4.

Alternatively, where it is desired to interconnect the capacitor with other components, such as additional capacitors residing in the same layer, the upper electrode can be patterned in such a way as to provide electrical conduits to the other components. In this case, the high-permittivity dielectric material is individually patterned prior to formation of the second electrode, as shown in FIG. 4.

Referring to FIG. 3-1, after the high-permittivity dielectric material is deposited and crystallized, a layer of electrode-forming material is deposited onto the dielectric material. Photomask 22 is defined on the electrode forming material, and an ion milling process is performed to etch both the electrode material and the underlying high-permittivity dielectric material. The etch process forms a second electrode 26 overlying dielectric layer 24. Preferably, second electrode 26 is platinum, or alternatively, second electrode 26 can be ruthenium dioxide.

The fabrication process illustrated in FIG. 3-1 can be extended to include the etching portions of refractory-metal oxide layer 16 that are not covered by dielectric layer 24. As illustrated in FIG. 3-2, this method can be used to etch away a portion of refractory-metal oxide layer 16 and expose an underlying portion of first electrode 14. Although, refractory-metal oxide layer 16 can be used as an etch-stop for an ion milling process, the refractory-metal oxide can also be etched in an appropriate plasma etching process. For example, in the case where refractory-metal oxide layer 16 is $TiO_2$ or $Ta_2O_5$, the refractory-metal oxide is etched by reactive ion etching using carbon tetrafluoride and oxygen. The reactive ion etch selectively etches the refractory-metal oxide layer much faster than the underlying platinum of first electrode 14. Exposing a portion of first electrode 14 adjacent to dielectric layer 24 provides a location for an electrical contact. An overlying metal interconnect (not shown) can then be electrically connected to the exposed portion of first electrode 14.

Upon formation of second electrode 26, a high-permittivity dielectric capacitor 28 has been fabricated. Referring to FIGS. 3-1 and 3-2, capacitor 28 includes first electrode 14, high-permittivity dielectric layer 24, and second electrode 26.

In an alternative process embodiment, capacitor 28 is fabricated by wet chemical etching techniques. After depositing a high-permittivity dielectric material, a layer of electrode-forming material is deposited onto the dielectric material. A photomask 23 is formed over the electrode-forming material, and a wet etch process is performed to define second electrode 26, as illustrated in FIG. 3-3. The wet etch solution isotropically etches the electrode forming material and slightly undercuts photomask 23. As depicted in FIG. 3—3, the edges of second electrode 26 are slightly recessed from the edges of photomask 23. Photomask 23 must be slightly oversized to allow for the undercut and to form second electrode to given dimensions, In the case where second electrode 26 is platinum, the platinum is preferably etched using a platinum etching solution containing hydrogen chloride, nitric acid, and a metal etching solution. The metal etching solution is the same as previously described. In a preferred embodiment, the first solution is prepared in an etch bath, and the first solution contains about 12.6 to 26.1 weight % hydrochloric acid, about 4.2 to 11.4 weight % nitric acid, and the remainder deionized water. In the most preferred embodiment, first solution contains 20.9 weight % hydrochloric acid, 6.7 weight % nitric acid, and the remainder deionized water. The first solution is heated to about 75° C. and metal etching solution is added while maintaining the bath temperature at about 70° to 80° C., thereby forming the platinum etching solution. Following the addition of the metal etching solution, the platinum etching solution preferably contains about 5 to 12 weight % metal etching solution, about 12 to 23 weight % hydrochloric acid, about 4 to 10 weight % nitric acid, and the remainder water to 100 weight %. In the most preferred embodiment the platinum etching solution contains 8.0 weight % metal etching solution, 19.2 weight % hydrochloric acid, and 6.2 weight % nitric acid, and the remainder water. Following preparation, the platinum etching solution is stabilized for about 10 to 30 minutes prior to use. After the stabilization period, substrate 10 is immersed in the platinum etching solution, and the platinum layer is selectively etched.

Once second electrode 26 is formed, photomask 23 is removed and a second photomask 25 is defined as illustrated in FIG. 3-4. Second photomask 25 overlies second electrode 26, and a portion of the high-permittivity dielectric layer adjacent to second electrode 26. Next, a dielectric etching solution (described below) is used to etch the high-permittivity dielectric material. The dielectric etching solution isotropically etches the dielectric material, which undercuts second photomask 25. The overlap of second photomask onto a portion of the high-permittivity dielectric layer insures that the undercut does not remove dielectric material underlying second electrode 26. As depicted in FIG. 3-4, following the wet etching process, dielectric layer 24 is slightly recessed from the edge of second photomask 25; however, the lateral dimensions of dielectric layer 24 are greater than second electrode 26.

In a preferred embodiment, the dielectric etching solution contains about 0.02 to 0.7 weight % hydrofluoric acid, 1 to 5 weight % nitric acid, 0 to 50 weight % hydrogen peroxide, and the remainder deionized water. In the most preferred embodiment, dielectric etching solution contains about 0.04 weight % hydrofluoric acid, 1.43 weight % nitric acid, 14.8 weight % hydrogen peroxide, and the remainder deionized water. Following preparation, the solution is stirred and substrate 10 is immersed in the dielectric etching solution to remove the exposed portions of the high-permittivity dielectric layer. The dielectric etching solution is prepared with reagent grade solutions of nitric acid (70 weight %), and hydrofluoric acid (49 weight %) solution. The hydrogen peroxide is reagent grade hydrogen peroxide obtained from a 31 weight % solution.

Figures 3, 4, 5:
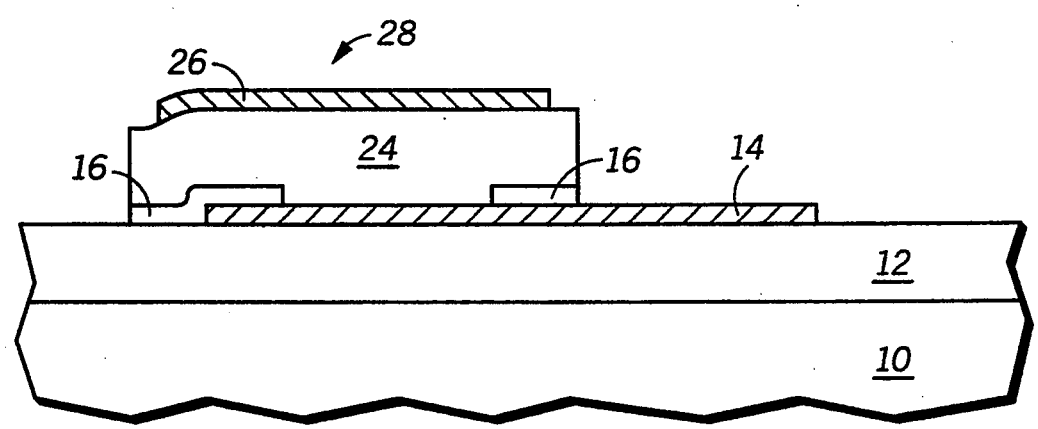
Figure 4:
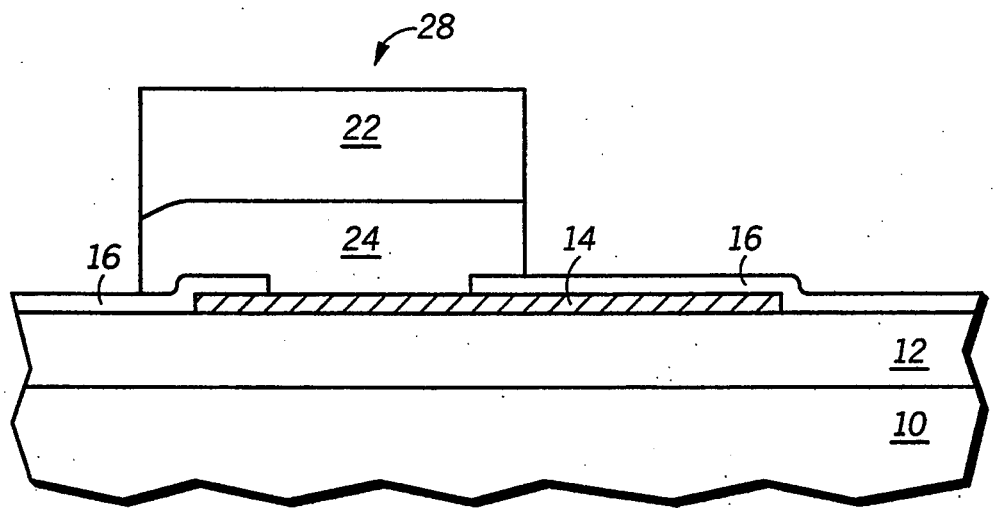
Figures 1, 5:
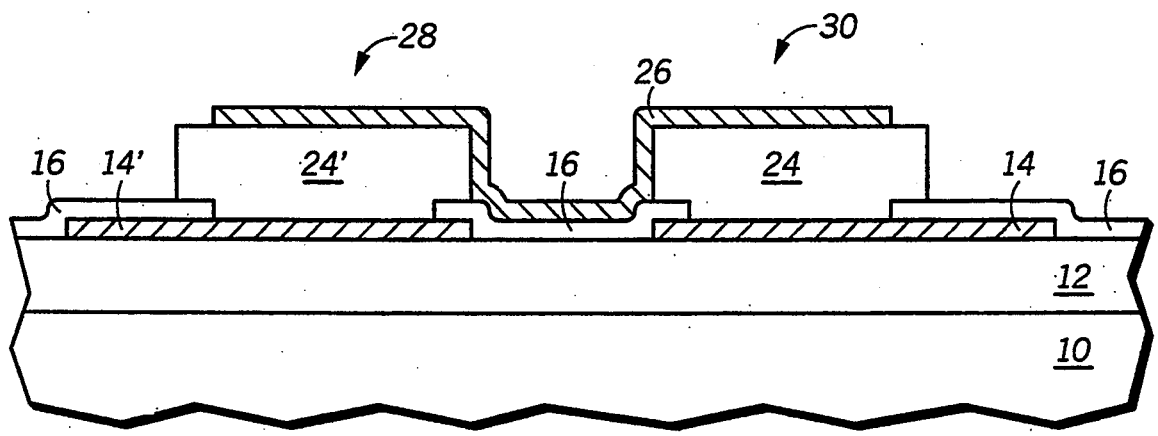
Figures 2, 5:
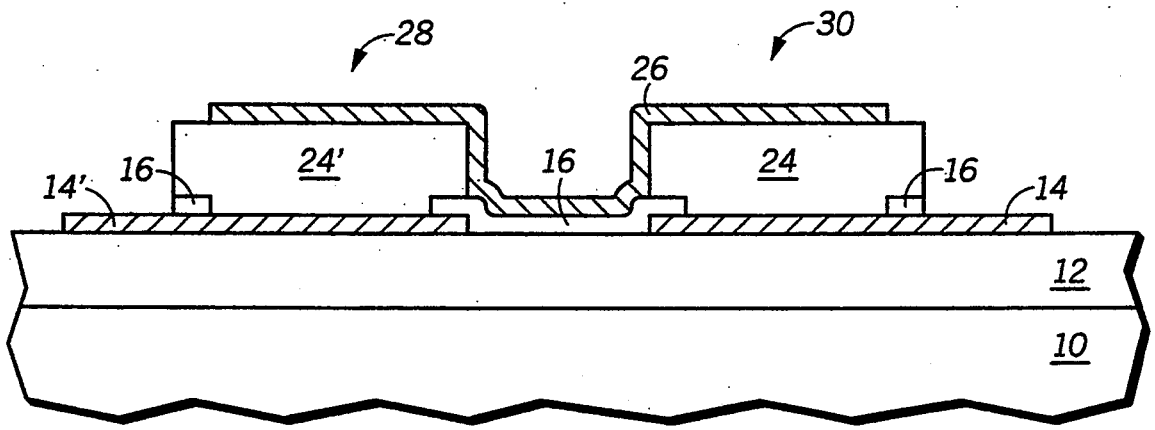

The fabrication process illustrated in FIGS. 3-3 and 3-4 can be extended to include the removal of portions of refractory-metal oxide layer 16 not protected by second photomask 25. As illustrated in FIG. 3-5, removal of unprotected portions of refractory-metal oxide layer 16 exposes a portion of first electrode 14. The process is substantially the same as that described in reference to FIG. 3-2.

Yet another alternative process for the fabrication of capacitor 28 is illustrated in FIG. 4. Following the deposition and crystallization of the high-permittivity dielectric material, photomask 22 is defined on the high-permittivity dielectric material. Preferably, the dielectric etching solution previously described is then used to etch the high-permittivity dielectric material, and to form dielectric layer 24. In an alternative etch process, an ion milling process is used to etch the high-permittivity dielectric material. In the ion milling process, the etching process can be stopped at any point, as long as refractory-metal oxide layer 16 has not been completely etched away. By stopping the ion milling process before refractory-metal oxide layer 16 is completely removed, first electrode 14 is protected from exposure to the ion milling process. This is important because certain materials from which first electrode 14 is constructed are readily susceptible to etching by ion milling. For example, the ion milling etch rate of platinum is approximately four times higher than the corresponding etch rate of a PZT dielectric material.

In yet another alternative method, a wet etch solution containing hydrogen fluoride and hydrogen chloride can be used to etch the high-permittivity dielectric material. In a still further alternative etching method, a halogen plasma etching process can be used. Because refractory-metal oxide layer 16 separates insulating layer 12 from dielectric layer 24, dielectric layer 24 can be patterned in a variety of geometric configurations. The dielectric pattern is not restricted to the area occupied by first electrode 14, as required by ferroelectric capacitor structures of the prior art. For example, as depicted in FIG. 4, dielectric layer 24 can extend beyond an edge of first electrode 14 and an overlying adjacent region of the substrate.

The ability of refractory-metal oxide layer 16 to function as an etch stop layer for the etching of a number of materials is an important advantage of the invention. Many of the high-permittivity dielectric materials are difficult to etch by conventional etching processes. Because these dielectrics are resistant to many etching methods, processes using energetic ion bombardment are often necessary to pattern the dielectric material. Refractory-metal oxides, such as $TiO_2$, $ZrO_2$, $HfO_2$ or $Ta_2O_5$, can be used to prevent a poor selectivity etching process, such as an ion milling process, from removing previously formed layers underlying the high-permittivity dielectric. The structure shown in FIG. 4 illustrates the application of refractory-metal oxide layer 16 as an etch-stop. In the absence of the refractory-metal oxide layer 16, after the unmasked portions of high-permittivity dielectric would be etched away, the ion milling process would rapidly etch first electrode 14 and insulating layer 12. The present invention allows the circuit designer to configure a high-permittivity capacitor in a large variety of patterns. The designer can choose a pattern precisely suited to the particular fabrication demands of the device in which the capacitor is to be used.

FIGS. 5-1 and 5-2 illustrate an embodiment of the invention wherein second electrode 26 interconnects two capacitors 28 and 30. Capacitors 28 and 30 can be fabricated by first patterning the high-permittivity dielectric material using the process illustrated in FIG. 4. Once the high-permittivity dielectric material has been patterned to form two dielectric layers 24 and 24', second electrode 26 is configured to overlie each dielectric layer and to electrically interconnect capacitors 28 and 30.

After forming second electrode 26, the exposed portions of refractory-metal oxide layer 16 are etched away, as illustrated in FIG. 5-2. To maintain optimal device performance, the total number of dielectric layers in an integrated circuit should be kept to a minimum. The removal of unneeded portions of refractory-metal oxide layer 16 reduces stray capacitance and capacitive coupling between the various components in the integrated circuit.

Thus it is apparent that there has been provided, in accordance with the invention, a high-permittivity dielectric capacitor for use in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other electrode configurations are possible to interconnect the capacitor to conductive layers below the insulating layer. It is therefore intended to include within the invention all such variations and modifications as fall within the scope of the appended claims and equivalents thereof.

We claim:

1. A process for fabricating a high-permittivity dielectric capacitor for use in a semiconductor device comprising:

providing a semiconductor substrate and an insulating layer, wherein the insulating layer lies over the semiconductor substrate;

forming a first electrode on the insulating layer;

forming a patterned refractory-metal oxide layer including an opening, wherein at least a portion of the refractory-metal oxide layer lies over a portion of the first electrode and all of the opening lies over a portion of the first electrode thereby leaving an exposed portion of the first electrode;

forming a patterned high-permittivity dielectric layer overlying the refractory-metal oxide and the exposed portion of the first electrode, wherein the patterned high-permittivity dielectric layer is separated from the insulating layer by at least the refractory-metal oxide in all regions away from the exposed portion of the first electrode; and forming a second electrode overlying the high-permittivity dielectric layer.

2. The process of claim 1, wherein the step of forming a high-permittivity dielectric layer comprises depositing a perovskite material selected from a group consisting of lead titanate, lead zirconium titanate, and lead lanthanum zirconium titanate.

3. The process of claim 1, wherein the step of forming the first electrode comprises the step of depositing a refractory-metal material selected from the group consisting of ruthenium dioxide, platinum, and a composite layer of platinum overlying titanium.

4. The process of claim 1, wherein the step of forming a patterned refractory-metal oxide comprises the step of depositing a refractory-metal oxide selected from the group consisting of titanium dioxide, hafnium dioxide, zirconium dioxide, and tantalum pentoxide.

5. The process of claim 1, wherein the step of forming a patterned refractory-metal oxide layer comprises the step of depositing a refractory-metal oxide, wherein the deposition process is selected from a group consisting of reactive sputter deposition, metal-organic chemical vapor deposition, and chemical vapor deposition of a refractory-metal followed by an anneal in an oxygen ambient.

6. The process of claim 5, wherein the step of forming a patterned refractory-metal oxide layer further comprises the steps of:

forming a photomask on the refractory-metal oxide; and etching the refractory-metal oxide to form the patterned refractory-metal oxide layer including the opening.

7. The process of claim 5 further comprising the steps of photomasking and etching the refractory-metal oxide to form the patterned refractory-metal oxide layer including the opening.

8. The process of claim 1, wherein the step of forming a patterned high-permittivity dielectric layer comprises the steps of:

depositing a layer of high-permittivity dielectric material onto the substrate to overlie the refractory-metal oxide and the first electrode;

crystallizing the high-permittivity dielectric material;

forming a photomask on the crystallized high-permittivity dielectric material; and etching the crystallized high-permittivity dielectric material using the refractory-metal oxide layer as an etch-stop.

9. The process of claim 8, wherein the step of depositing a layer of high-permittivity dielectric material comprises spin coating a sol-gel solution.

10. The process of claim 8 further comprising the step of etching the refractory-metal oxide using the photomask as an etch mask.

11. The process of claim 8, wherein the step of forming the second electrode comprises the step of depositing a layer selected from a group consisting of ruthenium dioxide and platinum onto the crystallized high-permittivity dielectric material prior to forming the photomask.

12. The process of claim 1, wherein the step of forming the second electrode comprises the steps of:

depositing a layer selected from a group consisting of ruthenium dioxide and platinum to overlie the patterned high-permittivity dielectric layer and the refractory-metal oxide; and etching the electrode material to form the second electrode, wherein the second electrode overlies additional patterned high-permittivity dielectric capacitors on the semiconductor substrate.

13. A process for fabricating a high-permittivity dielectric capacitor for use in a semiconductor device comprising:

providing a semiconductor substrate;

depositing an insulation layer over the substrate;

depositing an electrode layer selected from a group consisting of platinum or platinum over titanium onto the insulation layer;

etching the electrode layer to form a first electrode;

forming a refractory-metal oxide layer selected from a group consisting of titanium dioxide, hafnium dioxide, zirconium dioxide, and tantalum pentoxide to overlie the first electrode layer;

etching an opening in the refractory-metal oxide to expose a portion of the first electrode layer;

depositing a high-permittivity dielectric layer selected from a group consisting of lead titanate, lead lanthanum zirconium titanate, or lead lanthanum zirconium titanate overlying the refractory-metal oxide and contacting the first electrode layer;

annealing the substrate in an oxygen containing ambient to crystallize the high-permittivity dielectric layer; and etching the crystallized high-permittivity dielectric layer to form a capacitor pattern, such that the crystallized high-permittivity dielectric layer is separated from the insulation layer by at least the refractory-metal oxide layer in all regions away from the exposed portion of the first electrode layer.

14. The process of claim 13, wherein the step of etching the crystallized high-permittivity dielectric layer comprises a process selected from a group consisting of wet chemical etching and ion milling using the refractory-metal oxide layer as an etch-stop.

15. The process of claim 13 further comprising depositing a layer of platinum to overlie the crystallized high-permittivity dielectric layer.

16. A high-permittivity dielectric capacitor for use in a semiconductor device comprising:

a semiconductor substrate;

an insulating layer overlying the semiconductor substrate;

a first electrode on the insulating layer;

a refractory-metal oxide layer overlying a portion of the first electrode, refractory-metal oxide layer having an opening exposing a portion of the first electrode;

a patterned high-permittivity dielectric layer overlying the refractory-metal oxide and the exposed portion of the first electrode, wherein the patterned high-permittivity dielectric layer is separated from the insulating layer by at least the refractory-metal oxide layer in all regions away from the exposed portion of the first electrode; and a second electrode overlying the high-permittivity dielectric layer.

17. The capacitor of claim 16, wherein the high-permittivity dielectric layer comprises a perovskite material selected from a group consisting of lead titanate, lead zirconium titanate, and lead lanthanum zirconium titanate.

18. The capacitor of claim 16, wherein the first electrode comprises a refractory-metal material selected from a group consisting of ruthenium dioxide, platinum, and a composite layer of platinum overlying titanium.

19. The capacitor of claim 16, wherein the refractory-metal oxide is selected from a group consisting of titanium dioxide, hafnium dioxide, zirconium dioxide, and tantalum pentoxide.

20. The capacitor of claim 16, wherein the first electrode comprises a refractory-metal material selected from a group consisting of ruthenium dioxide and platinum.

* * * * *